United States Patent
Takano et al.

(10) Patent No.: US 10,859,606 B2
(45) Date of Patent: Dec. 8, 2020

(54) OFFSET ESTIMATION APPARATUS AND METHOD, CORRECTION APPARATUS FOR MAGNETIC SENSOR, AND CURRENT SENSOR

(71) Applicant: TDK CORPORATION, Tokyo (JP)

(72) Inventors: Kenichi Takano, Tokyo (JP); Yuta Saito, Tokyo (JP); Hiraku Hirabayashi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 247 days.

(21) Appl. No.: 16/007,426

(22) Filed: Jun. 13, 2018

(65) Prior Publication Data

US 2019/0033347 A1   Jan. 31, 2019

(30) Foreign Application Priority Data

Jul. 28, 2017   (JP) .................... 2017-146281

(51) Int. Cl.
| | |
|---|---|
| *G01R 15/20* | (2006.01) |
| *G01R 19/00* | (2006.01) |
| *G01R 33/00* | (2006.01) |
| *G01R 33/09* | (2006.01) |
| *G01R 15/14* | (2006.01) |
| *G01R 15/18* | (2006.01) |

(52) U.S. Cl.
CPC ......... *G01R 15/205* (2013.01); *G01R 15/148* (2013.01); *G01R 15/181* (2013.01); *G01R 19/0092* (2013.01); *G01R 33/0017* (2013.01); *G01R 33/091* (2013.01)

(58) Field of Classification Search
CPC .. G01R 15/148; G01R 15/181; G01R 15/205; G01R 19/0092; G01R 33/0017; G01R 33/091; G01R 33/0023; G01R 33/0029; G01R 33/0035; G01R 33/0041; G01R 33/007; G01R 33/0082
USPC .................................................. 324/202, 225
See application file for complete search history.

(56) References Cited

U.S. PATENT DOCUMENTS

| | | | |
|---|---|---|---|
| 6,316,939 B1* | 11/2001 | Nakagawa ........... | G01R 15/185 |
| | | | 324/117 R |
| 8,350,563 B2 | 1/2013 | Haas et al. | |
| 8,519,704 B2 | 8/2013 | Ide et al. | |
| 8,754,642 B2 | 6/2014 | Ide et al. | |
| 9,400,164 B2* | 7/2016 | Daubert ............... | G01R 33/007 |

(Continued)

*Primary Examiner* — Steven L Yeninas
(74) *Attorney, Agent, or Firm* — Oliff PLC

(57) ABSTRACT

An offset estimation unit determines an estimate of an offset of a detection value to be output from a magnetic sensor. The offset estimation unit includes an initial function storing unit, a function settlement unit, and an estimate determination unit. The initial function storing unit stores an initial function for determining the estimate according to a first variable and a second variable, with a reference offset as the first variable and temperature as the second variable, the reference offset being the offset at a reference temperature. The function settlement unit settles a value of the first variable of the initial function by the reference offset, and turns the initial function into an estimate determination function for determining the estimate according to a value of the second variable. The estimate determination unit determines the estimate by settling the value of the second variable of the estimate determination function by temperature information.

19 Claims, 10 Drawing Sheets

(56) References Cited

U.S. PATENT DOCUMENTS

| | | | | |
|---|---|---|---|---|
| 9,551,765 | B2* | 1/2017 | Rohrer | G01R 33/072 |
| 2006/0164079 | A1* | 7/2006 | Sato | G01R 33/0064 |
| | | | | 324/224 |
| 2006/0290348 | A1* | 12/2006 | Sato | G01R 33/0206 |
| | | | | 324/224 |
| 2012/0086442 | A1* | 4/2012 | Haas | G01R 33/0041 |
| | | | | 324/225 |
| 2013/0093416 | A1* | 4/2013 | Haas | G01R 33/072 |
| | | | | 324/225 |
| 2013/0335065 | A1* | 12/2013 | Fugate | G01R 33/0035 |
| | | | | 324/202 |
| 2015/0142356 | A1* | 5/2015 | Thomas | G01B 7/10 |
| | | | | 702/65 |
| 2016/0252589 | A1* | 9/2016 | Raman | G01R 33/0029 |
| | | | | 324/224 |
| 2020/0033384 | A1* | 1/2020 | Kishi | G01R 15/207 |

* cited by examiner

OFFSET ESTIMATION APPARATUS AND METHOD, CORRECTION APPARATUS FOR MAGNETIC SENSOR, AND CURRENT SENSOR

BACKGROUND OF THE INVENTION

1. Field of the Invention

The present invention relates to an offset estimation apparatus and method for determining an estimate of an offset of a detection value to be output from a magnetic sensor, a correction apparatus for a magnetic sensor for correcting a magnetic field detection value to be output from the magnetic sensor or a value obtained on the basis of the magnetic field detection value, and a current sensor including the correction apparatus.

2. Description of the Related Art

Magnetic balance type current sensors, such as one disclosed in U.S. Pat. No. 8,754,642 B2, are known as current sensors that are capable of accurately detecting the value of a current to be detected flowing through a conductor. In general, a magnetic balance type current sensor includes a feedback coil, a magnetic sensor, a feedback circuit, and a current detector. The feedback coil is intended to generate a second magnetic field that cancels out a first magnetic field generated by the current to be detected flowing through the conductor. The magnetic sensor detects a residual magnetic field between the first and second magnetic fields as a magnetic field to be detected, and generates a magnetic field detection value dependent on the strength of the magnetic field to be detected. The feedback circuit controls, in accordance with the magnetic field detection value, a feedback current for generating the second magnetic field, and passes the feedback current through the feedback coil. The current detector detects the value of the feedback current. An example of the current detector is a resistor inserted to a current path of the feedback current. A potential difference across the resistor corresponds to the detected value of the feedback current. The value of the feedback current detected by the current detector will hereinafter be referred to as a current detection value. The current detection value is in proportion to the value of the current to be detected. The current detection value thus corresponds to the detected value of the current to be detected. The magnetic balance type current sensor operates so that the magnetic field to be detected by the magnetic sensor approaches zero.

The magnetic sensor is designed so that the magnetic field detection value when there is no magnetic field to be detected is equal to a predetermined reference value. In reality, however, the magnetic field detection value when there is no magnetic field to be detected may differ from the predetermined reference value. A deviation of the magnetic field detection value when there is no magnetic field to be detected from the predetermined reference value will hereinafter be referred to as an offset of the magnetic field detection value, or simply as an offset. The offset may change with temperature. The manner in which the offset changes in response to a change in temperature may vary from one magnetic sensor to another.

The offset of the magnetic field detection value has an adverse effect on the system that uses the magnetic field detection value. In particular, since the magnetic balance type current sensor operates so that the magnetic field to be detected by the magnetic sensor approaches zero, the offset of the magnetic field detection value has a large adverse effect. Specifically, the offset of the magnetic field detection value may cause a large error in the current detection value. It is thus desired that processing for reducing the adverse effect of the offset of the magnetic field detection value be performed on the magnetic balance type current sensor, in particular. Such processing will hereinafter be referred to as offset correction.

U.S. Pat. No. 8,754,642 B2 describes a technique of subtracting an offset amount, which results from hysteresis of a magnetoresistive element, from an amplifier output, which corresponds to a magnetic field detection value.

U.S. Pat. No. 8,350,563 B2 describes a technique of measuring offsets in a magnetic sensor at a plurality of temperatures, generating an offset characteristic curve representing changes in offset in response to changes in temperature, and controlling offsets by using the offset characteristic curve.

According to the technique described in U.S. Pat. No. 8,754,642 B2, the offset amount is constant regardless of temperature. This technique is thus insufficient to perform appropriate offset correction in consideration of changes in offset in response to changes in temperature.

According to the technique described in U.S. Pat. No. 8,350,563 B2, as mentioned above, offsets at a plurality of temperatures are measured to generate an offset characteristic curve. However, it is extremely inefficient to perform the processing for generating an offset characteristic curve for each individual magnetic sensor over the use temperature range of, for example, −40° C. to 125° C.

SUMMARY OF THE INVENTION

It is an object of the present invention to provide an offset estimation apparatus and method, a correction apparatus for a magnetic sensor, and a current sensor that make it possible to perform appropriate offset estimation in consideration of changes in the offset of a magnetic field detection value in response to changes in temperature by relatively simple processing.

An offset estimation apparatus of the present invention is an apparatus for determining an estimate of an offset of a magnetic field detection value to be output from a magnetic sensor that detects a magnetic field to be detected and generates the magnetic field detection value dependent on the strength of the magnetic field to be detected. An offset estimation method of the present invention is a method for determining an estimate of an offset of a magnetic field detection value to be output from a magnetic sensor that detects a magnetic field to be detected and generates the magnetic field detection value dependent on the strength of the magnetic field to be detected. The offset is a deviation, from a predetermined reference value, of the magnetic field detection value when there is no magnetic field to be detected.

The offset estimation apparatus of the present invention includes an initial function storing unit, a function settlement unit, and an estimate determination unit. The initial function storing unit is configured to store an initial function for determining the estimate according to a first variable and a second variable, with a reference offset as the first variable and temperature as the second variable, the reference offset being the offset at a reference temperature. The function settlement unit is configured to receive the reference offset, settle a value of the first variable of the initial function stored in the initial function storing unit by the received reference offset, and thereby turn the initial function into an estimate determination function for determining the estimate according to a value of the second variable. The estimate determination unit is configured to receive temperature information indicative of temperature, settle the value of the second variable of the estimate determination function by the received temperature information, and thereby determine the estimate by using the estimate determination function.

In the offset estimation apparatus of the present invention, the initial function storing unit, the function settlement unit and the estimate determination unit may each be composed of a signal processing circuit or a digital signal processing circuit.

The offset estimation method of the present invention includes an initial function generation procedure, a function settlement procedure, and an estimate determination procedure. The initial function generation procedure generates an initial function for determining the estimate according to a first variable and a second variable, with a reference offset as the first variable and temperature as the second variable, the reference offset being the offset at a reference temperature. The function settlement procedure receives the reference offset, settles a value of the first variable of the initial function by the received reference offset, and thereby turns the initial function into an estimate determination function for determining the estimate according to a value of the second variable. The estimate determination procedure receives temperature information indicative of temperature, settles the value of the second variable of the estimate determination function by the received temperature information, and thereby determines the estimate by using the estimate determination function.

In the offset estimation method of the present invention, the function settlement procedure and the estimate determination procedure may each be performed by a signal processing circuit or a digital signal processing circuit.

A correction apparatus for a magnetic sensor of the present invention is an apparatus for correcting a magnetic field detection value to be output from the magnetic sensor or a value obtained on the basis of the magnetic field detection value, the magnetic sensor detecting a magnetic field to be detected and generating the magnetic field detection value dependent on the strength of the magnetic field to be detected. The correction apparatus includes an offset estimation unit for determining an estimate of an offset of the magnetic field detection value, and a correction unit for correcting the magnetic field detection value or the value obtained on the basis of the magnetic field detection value, by using the estimate determined by the offset estimation unit. The details of the offset estimation unit are the same as those of the offset estimation apparatus of the present invention.

In the correction apparatus of the present invention, the offset estimation unit and the correction unit may each be composed of a signal processing circuit or a digital signal processing circuit.

A current sensor of the present invention includes a coil, a magnetic sensor, a feedback circuit, a current detector, and a correction apparatus. The coil is intended to generate a second magnetic field that cancels out a first magnetic field generated by a current to be detected. The magnetic sensor detects a residual magnetic field between the first and second magnetic fields as a magnetic field to be detected, and generates a magnetic field detection value dependent on the strength of the magnetic field to be detected. The feedback circuit controls, in accordance with the magnetic field detection value or a value obtained on the basis of the magnetic field detection value, a feedback current for generating the second magnetic field, and passes the feedback current through the coil. The current detector detects the value of the feedback current. The correction apparatus corrects the magnetic field detection value or the value obtained on the basis of the magnetic field detection value. The details of the correction apparatus are the same as those of the correction apparatus for a magnetic sensor of the present invention.

In the current sensor of the present invention, the offset estimation unit and the correction unit of the correction apparatus may each be composed of a signal processing circuit or a digital signal processing circuit.

In the offset estimation apparatus and method, the correction apparatus for a magnetic sensor, and the current sensor of the present invention, the initial function may be expressed as $OSes(T)=OSst+A(OSst)\times(T-Tst)$, where $OSes(T)$ is the estimate of the offset, $OSst$ is the reference offset, $T$ is the temperature indicated by the temperature information, $Tst$ is the reference temperature, and $A(OSst)$ is a gradient of change of $dOS(T)$ with respect to a change in the temperature, $dOS(T)$ being an offset change estimate, the offset change estimate being an estimate of an amount of change of the offset at the temperature $T$ from the reference offset, wherein $A(OSst)$ is determined by the value of the reference offset.

In the offset estimation method of the present invention, $A(OSst)$ may be expressed as $k\times OSst+C$. In such a case, the initial function generation procedure may include a first step of determining respective reference offsets and respective gradients of changes in the offsets with respect to a change in the temperature for a plurality of samples of the magnetic sensor, and a second step of determining k and C on the basis of the reference offsets and the gradients obtained for the plurality of samples in the first step.

In the current sensor of the present invention, the magnetic sensor may include a magnetoresistive element. The current sensor of the present invention may further include a temperature sensor for generating the temperature information.

According to the offset estimation apparatus and method, the correction apparatus for a magnetic sensor, and the current sensor of the present invention, the value of the first variable of the initial function is settled by the reference offset. Once the value of the first variable has been settled, the estimate determination function for determining the estimate according to the value of the second variable, i.e., temperature, is determined. The present invention thus makes it possible to perform appropriate offset estimation in consideration of changes in the offset of the magnetic field detection value in response to changes in temperature by relatively simple processing.

Other and further objects, features and advantages of the present invention will appear more fully from the following description.

DETAILED DESCRIPTION OF THE PREFERRED EMBODIMENT

Figure 1:
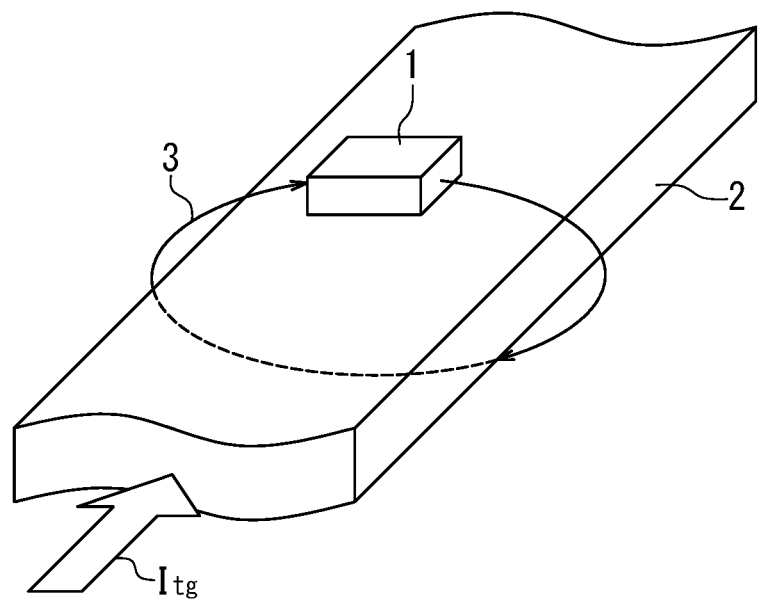
FIG. 1 is a perspective view illustrating the configuration of a system including a current sensor according to an embodiment of the invention.

A preferred embodiment of the present invention will now be described in detail with reference to the drawings. First, reference is made to FIG. 1 to describe the configuration of a system including a current sensor according to the embodiment of the invention. The current sensor 1 according to the embodiment is to detect the value of a current to be detected flowing through a conductor. FIG. 1 illustrates an example in which the conductor through which the current to be detected flows is a bus bar 2. The current sensor 1 is disposed near the bus bar 2. Hereinafter, the current to be detected will be referred to as target current Itg. The target current Itg generates a magnetic field 3 around the bus bar 2. The current sensor 1 is disposed at a position where the magnetic field 3 is applied.

Figure 2:
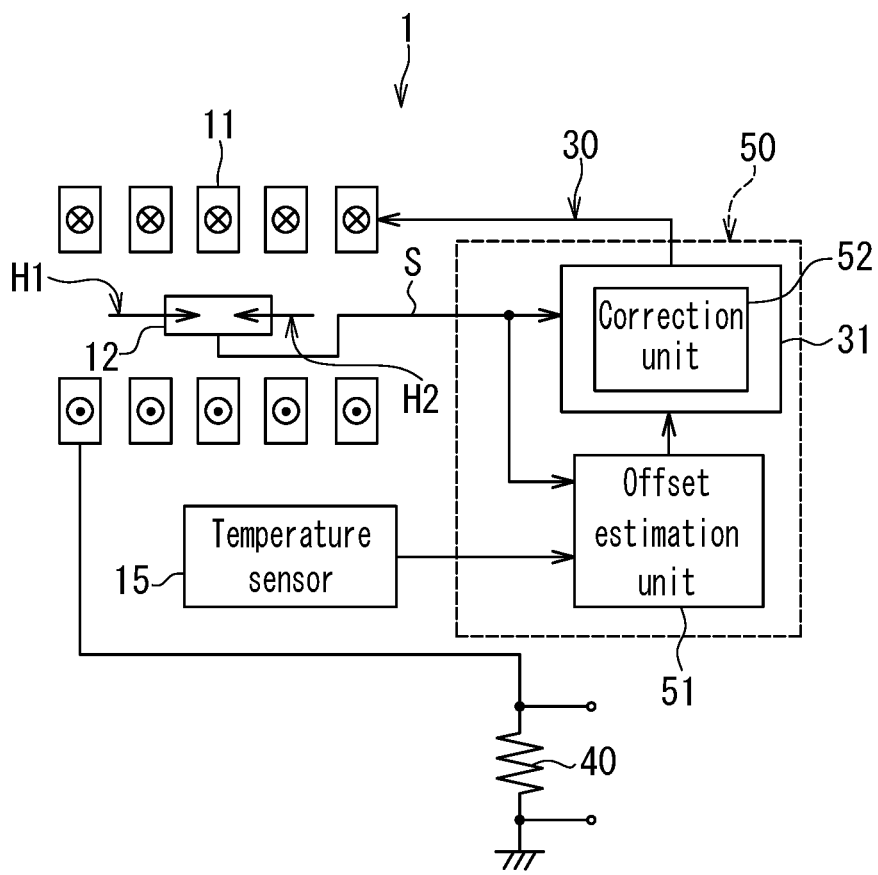
FIG. 2 is a block diagram illustrating the configuration of the current sensor according to the embodiment of the invention.

FIG. 2 is a block diagram illustrating the configuration of the current sensor 1. The current sensor 1 is a magnetic balance type current sensor. As shown in FIG. 2, the current sensor 1 includes a coil 11 and a magnetic sensor 12.

A portion of the magnetic field 3 generated by the target current Itg that is detectable by the magnetic sensor 12 will be referred to as the first magnetic field H1. The coil 11 is to generate a second magnetic field H2 that cancels out the first magnetic field H1. The magnetic sensor 12 detects, as a magnetic field to be detected, a residual magnetic field between the first magnetic field H1 and the second magnetic field H2, and generates a magnetic field detection value S dependent on the strength of the magnetic field to be detected. Hereinafter, the magnetic field to be detected will be referred to as the target magnetic field Htg.

The magnetic sensor 12 may include at least one magnetoresistive element. The magnetoresistive element may be a spin-valve magnetoresistive element or an anisotropic magnetoresistive (AMR) element. The spin-valve magnetoresistive element may be a tunneling magnetoresistive (TMR) element or a giant magnetoresistive (GMR) element. The spin-valve magnetoresistive element includes a magnetization pinned layer whose magnetization direction is pinned, a free layer which is a magnetic layer whose magnetization direction varies depending on the direction and strength of an applied magnetic field, a nonmagnetic layer located between the magnetization pinned layer and the free layer, and an antiferromagnetic layer. The magnetization pinned layer is located between the antiferromagnetic layer and the nonmagnetic layer. The antiferromagnetic layer is formed of an antiferromagnetic material, and establishes exchange coupling with the magnetization pinned layer to pin the magnetization direction of the magnetization pinned layer. In TMR elements, the nonmagnetic layer is a tunnel barrier layer. In GMR elements, the nonmagnetic layer is a nonmagnetic conductive layer.

The current sensor 1 further includes a feedback circuit 30, a current detector 40, a correction apparatus 50, and a temperature sensor 15. The feedback circuit 30 controls, in accordance with the magnetic field detection value S or a value obtained on the basis of the magnetic field detection value S, a feedback current for generating the second magnetic field H2, and passes the feedback current through the coil 11. Hereinafter, a value obtained on the basis of the magnetic field detection value S will be referred to as S-based value. The current detector 40 detects the value of the feedback current flowing through the coil 11. The current detector 40 is, for example, a resistor inserted to a current path of the feedback current. A potential difference across the resistor corresponds to the detected value of the feedback current. A value of the feedback current detected by the current detector will hereinafter be referred to as a current detection value. The current detection value is in proportion to the value of the target current Itg. The current detection value thus corresponds to the detected value of the target current Itg. The correction apparatus 50 corrects the magnetic field detection value S or the S-based value. The temperature sensor 15 detects temperature and generates temperature information indicative of the temperature.

An example of configuration of the magnetic sensor 12 will now be described. In this example, the magnetic sensor 12 includes a Wheatstone bridge circuit 13.

Figure 3:
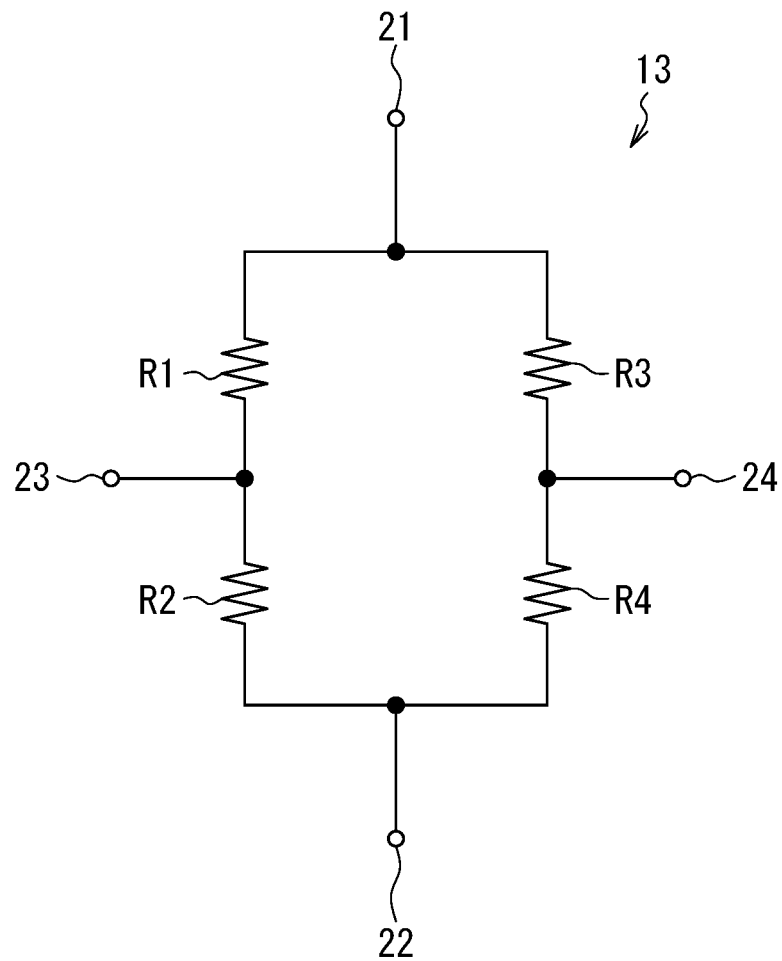
FIG. 3 is a circuit diagram illustrating a Wheatstone bridge circuit, which is part of a magnetic sensor of FIG. 2.

FIG. 3 is a circuit diagram illustrating the Wheatstone bridge circuit 13. The Wheatstone bridge circuit 13 has a power supply port 21, a ground port 22, a first output port 23, a second output port 24, and four resistor sections R1, R2, R3 and R4.

The resistor section R1 is provided between the power supply port 21 and the first output port 23. The resistor section R2 is provided between the first output port 23 and the ground port 22. The resistor section R3 is provided between the power supply port 21 and the second output port 24. The resistor section R4 is provided between the second output port 24 and the ground port 22. The power supply port 21 is configured to receive a power supply voltage of predetermined magnitude. The ground port 22 is connected to the ground.

Each of the resistor sections R1, R2, R3 and R4 includes a spin-valve magnetoresistive element. The magnetization pinned layer of the magnetoresistive element of each of the resistor sections R1 and R4 is magnetized in a first direction. The magnetization pinned layer of the magnetoresistive element of each of the resistor sections R2 and R3 is magnetized in a second direction opposite to the first direction. Here, a direction parallel to the first and second directions will be referred to as magnetosensitive direction. The free layer of each magnetoresistive element preferably has a shape magnetic anisotropy whose easy axis is orthogonal to the magnetosensitive direction.

The magnetic field 3 generated by the target current Itg and a magnetic field generated by the coil 11 are applied to the Wheatstone bridge circuit 13. The Wheatstone bridge circuit 13 is positioned such that the directions of the aforementioned two magnetic fields to be applied thereto are opposite or substantially opposite to each other, and is oriented such that the magnetosensitive direction is parallel or substantially parallel to the directions of the aforementioned two magnetic fields.

In this example, the first magnetic field H1 is a component in the magnetosensitive direction of the magnetic field generated by the target current Itg and applied to the Wheatstone bridge circuit 13. The second magnetic field H2 is a component in the magnetosensitive direction of the magnetic field generated by the coil 11 and applied to the Wheatstone bridge circuit 13.

In the Wheatstone bridge circuit 13, a potential difference between the output ports 23 and 24 varies depending on the strength of the target magnetic field Htg. The magnetic sensor 12 outputs a magnetic field detection value S corresponding to the potential difference between the output ports 23 and 24 of the Wheatstone bridge circuit 13. The strength of the target magnetic field Htg, the potential difference between the output ports 23 and 24, and the magnetic field detection value S can be of positive or negative values depending on the magnitudes of the first magnetic field H1 and the second magnetic field H2 relative to each other.

The correction apparatus 50 includes an offset estimation unit 51 for determining an estimate OSes(T) of an offset OS of the magnetic field detection value S, and a correction unit 52 for correcting the magnetic field detection value S or the S-based value by using the estimate OSes(T) determined by the offset estimation unit 51. The offset estimation unit 51 is also an offset estimation apparatus according to this embodiment.

Offset OS is a deviation of the magnetic field detection value S when there is no target magnetic field Htg from a predetermined reference value. In this embodiment, the magnetic field detection value S is in units of mV. The predetermined reference value is 0 mV, for example.

The correction unit 52 acts to subtract the estimate OSes(T) from the magnetic field detection value S or the S-based value.

The feedback circuit 30 includes a feedback control circuit 31. The feedback control circuit 31 generates and supplies to the coil 11 a feedback current that is controlled in accordance with the magnetic field detection value S or the S-based value. The S-based value may be the integral of the magnetic field detection value S, for example.

In this embodiment, the feedback control circuit 31 includes the correction unit 52 of the correction apparatus 50. The feedback control circuit 31 controls the feedback current in accordance with the magnetic field detection value S or the S-based value after the correction by the correction unit 52. The feedback control circuit 31 may include, for example, an analog circuit section for generating the feedback current, and a digital signal processing circuit for controlling the analog circuit section. The correction unit 52 may be composed of a signal processing circuit, such as a digital signal processing circuit.

The offset estimation unit 51 may be composed of a signal processing circuit, such as a digital signal processing circuit. The digital signal processing circuit in the feedback control circuit 31, and the digital signal processing circuit constituting the offset estimation unit 51 can each be implemented by a digital signal processor (DSP), for example.

Figure 4:
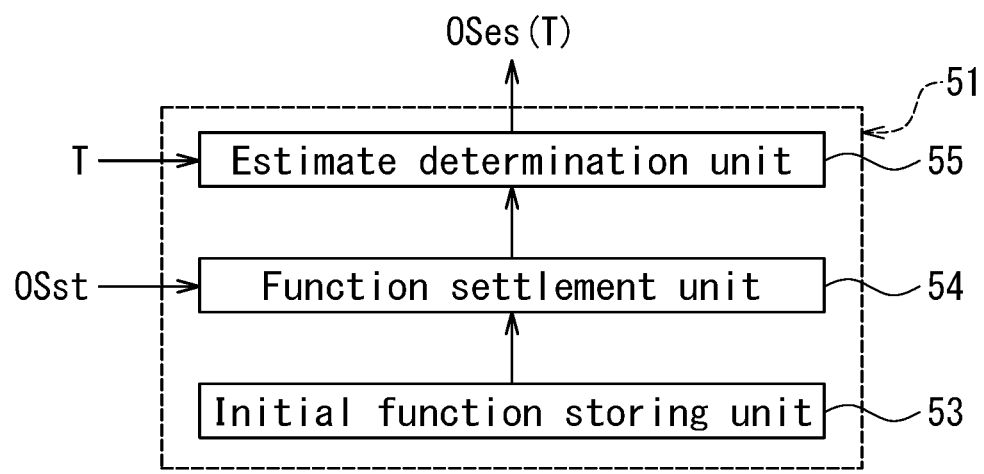
FIG. 4 is a functional block diagram illustrating the configuration of an offset estimation unit of FIG. 2.

FIG. 4 is a functional block diagram illustrating the configuration of the offset estimation unit 51. As shown in FIG. 4, the offset estimation unit 51 includes an initial function storing unit 53, a function settlement unit 54, and an estimate determination unit 55. The initial function storing unit 53, the function settlement unit 54, and the estimate determination unit 55 may each be composed of a signal processing circuit, such as a digital signal processing circuit.

The initial function storing unit 53 stores an initial function for determining the estimate OSes(T) according to a first variable and a second variable, with a reference offset OSst as the first variable and temperature T as the second variable. The reference offset OSst is an offset OS at a reference temperature Tst. The temperature T is in units of ° C. In view of facilitating the acquisition of the reference offset OSst, the reference temperature Tst is preferably a normal temperature. In this embodiment, the reference temperature Tst is 25° C.

The function settlement unit 54 receives the reference offset OSst and settles, by the received reference offset OSst, the value of the first variable of the initial function stored in the initial function storing unit 53. The function settlement unit 54 thereby turns the initial function into an estimate determination function for determining the estimate OSes(T) according to the value of the second variable.

The estimate determination unit 55 receives the temperature information indicative of the temperature T, settles the value of the second variable of the estimate determination function by the received temperature information, and thereby determines the estimate OSes(T) by using the estimate determination function. The estimate OSes(T) is transmitted to the correction unit 52 in the feedback control circuit 31. The estimate OSes(T) is in units of mV.

Figure 5:
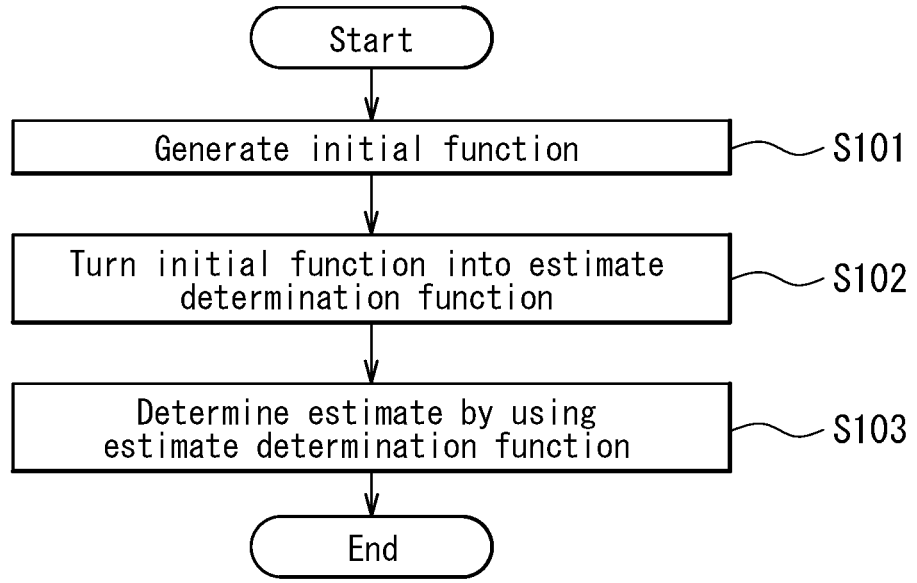
FIG. 5 is a flowchart of an offset estimation method according to the embodiment of the invention.

Reference is now made to FIG. 5 to describe the offset estimation method according to this embodiment. The offset estimation method according to the embodiment includes an initial function generation procedure S101, a function settlement procedure S102, and an estimate determination procedure S103.

In the initial function generation procedure S101, an initial function is generated. The initial function is stored in the initial function storing unit 53. The initial function generation procedure S101 is performed before the current sensor 1 as a product is completed. In the initial function generation procedure S101, the initial function is generated by performing measurement using a plurality of samples of the magnetic sensor 12 for use in the current sensor 1. The plurality of samples have the same design configuration. In the initial function generation procedure S101, the generated initial function is stored into the initial function storing unit 53. This completes the current sensor 1 as a product.

The function settlement procedure S102 is performed by the function settlement unit 54. The function settlement procedure S102 may be performed by a signal processing circuit, such as a digital signal processing circuit. In the function settlement procedure S102, the reference offset OSst is received, and the value of the first variable of the initial function stored in the initial function storing unit 53 is settled by the received reference offset OSst. The initial function is thereby turned into the estimate determination function. The function settlement procedure S102 is performed at least once after the completion of the current sensor 1 as a product. The function settlement procedure S102 may be performed before shipment of the current sensor 1 or after the current sensor 1 is usably installed.

The estimate determination procedure S103 is performed by the estimate determination unit 55. The estimate determination procedure S103 may be performed by a signal processing circuit, such as a digital signal processing circuit. In the estimate determination procedure S103, the temperature information indicative of the temperature T is received from the temperature sensor 15, and the value of the second variable of the estimate determination function is settled by the received temperature information to thereby determine the estimate OSes(T) by using the estimate determination function. The estimate determination procedure S103 is performed during use of the current sensor 1.

The offset estimation method according to the embodiment and the operation of the offset estimation unit 51 will be described in more detail later.

Figure 6:
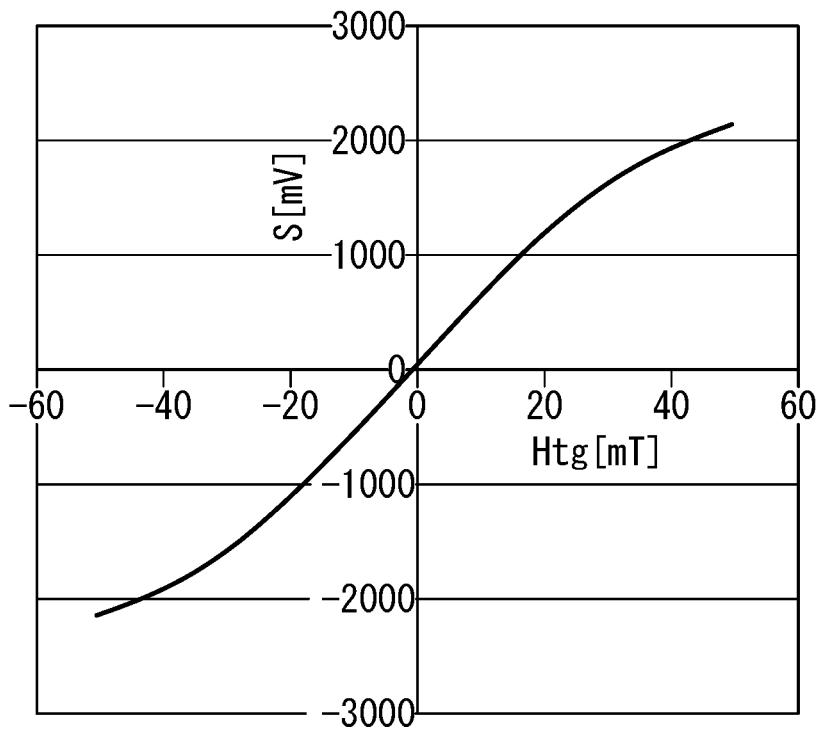
FIG. 6 is a characteristic diagram illustrating an example characteristic of the magnetic sensor of the embodiment of the invention.
Figure 7:
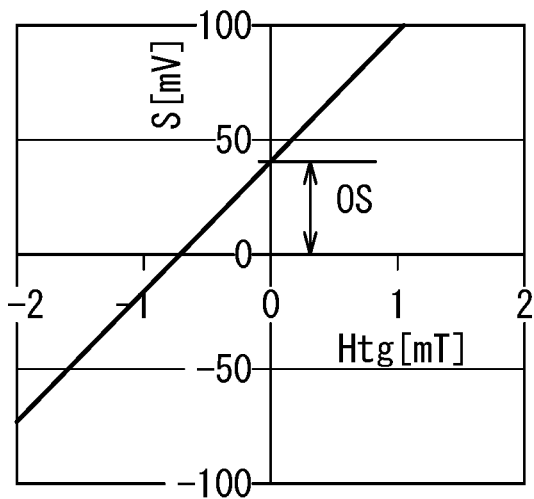
FIG. 7 is a characteristic diagram showing part of the characteristic shown in FIG. 6 on an enlarged scale.
Figure 8:
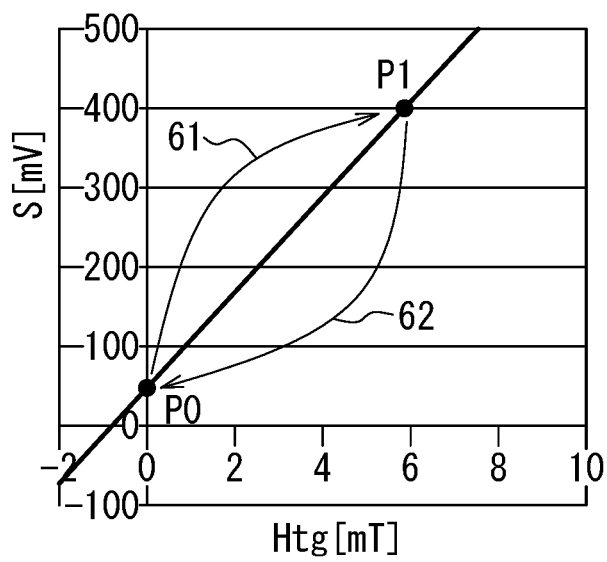
FIG. 8 is a characteristic diagram illustrating an example of changes in magnetic field detection value for the current sensor according to the embodiment of the invention.

Now, offset OS of the magnetic field detection value S will be described with reference to FIG. 6 and FIG. 7. FIG. 6 illustrates an example characteristic of the magnetic sensor 12. Specifically, FIG. 6 illustrates the relationship between the target magnetic field Htg and the magnetic field detection value S. In FIG. 6, the horizontal axis represents the target magnetic field Htg, and the vertical axis represents the magnetic field detection value S. FIGS. 6 and 7, and FIG. 8 to be described later show the strength of the target magnetic field Htg by using magnetic flux density, which is in proportion to the strength of the target magnetic field Htg.

FIG. 7 shows part of the characteristic shown in FIG. 6 on an enlarged scale. As shown in FIG. 7, the magnetic field detection value S may have an offset OS. The offset OS is a deviation of the magnetic field detection value S when there is no target magnetic field Htg from a predetermined reference value, i.e., 0 mV.

The operation of the current sensor 1 according to the embodiment will now be described. FIG. 8 shows an example of changes in the magnetic field detection value S. In FIG. 8, the horizontal axis represents the target magnetic field Htg, and the vertical axis represents the magnetic field detection value S. In FIG. 8, point P0 represents the target magnetic field Htg and the magnetic field detection value S when no target current Itg flows through the bus bar 2. In this example, the magnetic field detection value S has an offset OS. The magnetic field detection value S at the point P0 is thus equal to the offset OS.

When a target current Itg flows through the bus bar 2, the first magnetic field H1 is applied to the magnetic sensor 12. If no second magnetic field H2 is generated by the coil 11, the first magnetic field H1 is the target magnetic field Htg. This makes the magnetic field detection value S be a value corresponding to the first magnetic field H1. Point P1 in FIG. 8 represents the target magnetic field Htg and the magnetic field detection value S when no second magnetic field H2 is generated. Thus, upon change from the state where no target current Itg flows through the bus bar 2 to the state where the target current Itg flows through the bus bar 2, the point representing the target magnetic field Htg and the magnetic field detection value S initially moves from the point P0 to the point P1 as shown by the arrow 61 in FIG. 8.

The feedback circuit 30 controls, in accordance with the magnetic field detection value S or an S-based value, a feedback current for generating the second magnetic field H2 that cancels out the first magnetic field H1, and passes the feedback current through the coil 11. This causes the coil 11 to generate the second magnetic field H2. As a result, the target magnetic field Htg becomes zero, and the magnetic field detection value S becomes equal to the offset OS. Thus, by the operation of the feedback circuit 30, the point representing the target magnetic field Htg and the magnetic field detection value S is moved from the point P1 to the point P0 as shown by the arrow 62 in FIG. 8.

If the target current Itg changes in value, the feedback circuit 30 changes the value of the feedback current to be passed through the coil 11 in accordance with the magnetic field detection value S or the S-based value so that the target magnetic field Htg approaches zero.

If the magnetic field detection value S includes an offset OS as shown in FIG. 8, the feedback circuit 30 changes the value of the feedback current to be passed through the coil 11 so that the magnetic field detection value S approaches the offset OS. This is accomplished by controlling the feedback current by the feedback control circuit 31 in accordance with the magnetic field detection value S or the S-based value after the correction using the estimate OSes (T).

The value of the feedback current flowing through the coil 11 is detected by the current detector 40. The current detection value obtained by the current detector 40 corresponds to the detected value of the target current Itg. The value of the target current Itg can thus be detected by the current sensor 1.

The offset OS may change with temperature T. Thus, if an estimate that is constant regardless of temperature T is used instead of the estimate OSes(T) of this embodiment, an error may occur in the current detection value because, depending on the temperature T, the offset OS may be different from the constant estimate and it follows that the feedback control circuit 31 controls the value of the feedback current to be passed through the coil 11 so that the magnetic field detection value S will approach the constant estimate which may be different from the offset OS.

Figure 9:
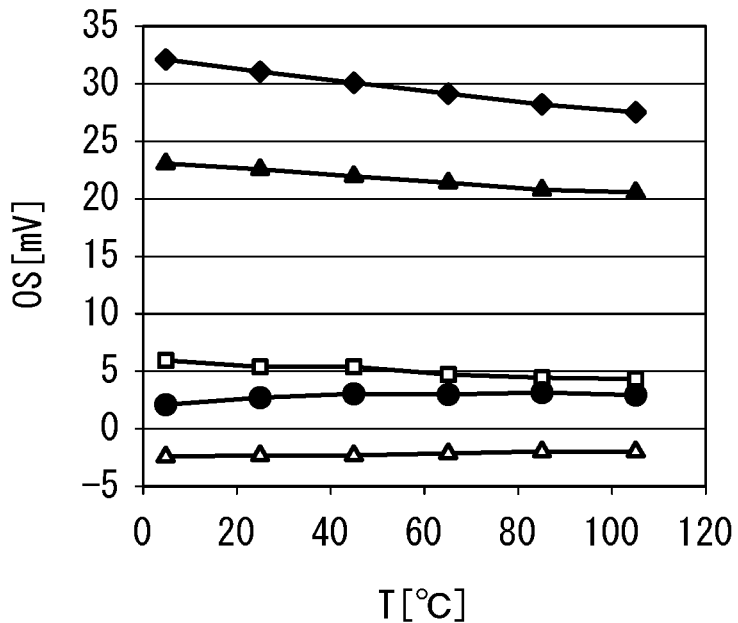
FIG. 9 is a characteristic diagram illustrating an example of temperature characteristics of offsets in five samples of the magnetic sensor.

FIG. 9 illustrates temperature characteristics of offsets OS in five samples of the magnetic sensor 12 having the same design configuration. In FIG. 9, the horizontal axis represents temperature T, and the vertical axis represents offset OS. As shown in FIG. 9, the five samples differ from each other in the manner in which their offsets OS change in response to a change in temperature T.

Offset correction methods of first and second comparative examples and problems thereof will now be described with reference to the five samples having the characteristics shown in FIG. 9 as an example.

Initially, the offset correction method of the first comparative example will be described. In the first comparative example, offset correction is performed by using an estimate that is constant regardless of temperature T, instead of the estimate OSes(T) of this embodiment. In the first comparative example, the offset OS at 25° C. is used as the estimate. The five samples have respective different estimates.

Figure 10:
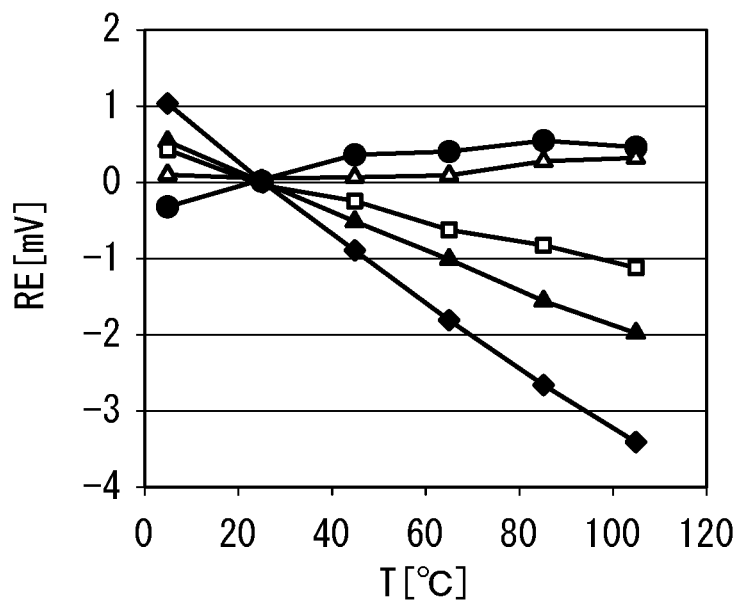
FIG. 10 is a characteristic diagram illustrating temperature characteristics of offset residuals in an offset correction method of a first comparative example.

A value obtained by subtracting the estimate from the offset OS will be referred to as offset residual RE. FIG. 10 shows the temperature characteristics of the offset residuals RE for the five samples when the offset correction method of the first comparative example is applied thereto. In FIG. 10, the horizontal axis represents temperature T, and the vertical axis represents offset residual RE. As shown in FIG. 10, the offset residuals RE of some samples are large in absolute value when the temperature T is other than 25° C. Thus, the offset correction method of the first comparative example cannot accomplish appropriate offset correction in consideration of changes in offset in response to changes in temperature.

Next, the offset correction method of the second comparative example will be described. In the second comparative example, offset correction is performed by using an estimate OSesa(T) expressed by Eq. (1) below, instead of the estimate OSes(T) of this embodiment.

$$OSesa(T)=OS(25)+dOSa(T) \quad (1)$$

In Eq. (1), OS(25) represents the offset OS at 25° C., and dOSa(T) represents an offset change estimate. The offset change estimate dOSa(T) is an estimate of the amount of change of the offset OS at a temperature T from OS(25). dOSa(T) is expressed by Eq. (2) below.

$$dOSa(T)=A \times (T-25) \quad (2)$$

In Eq. (2), the coefficient A is an average of the gradients of changes in the offsets OS of the five samples with respect to a change in temperature.

Figure 11:
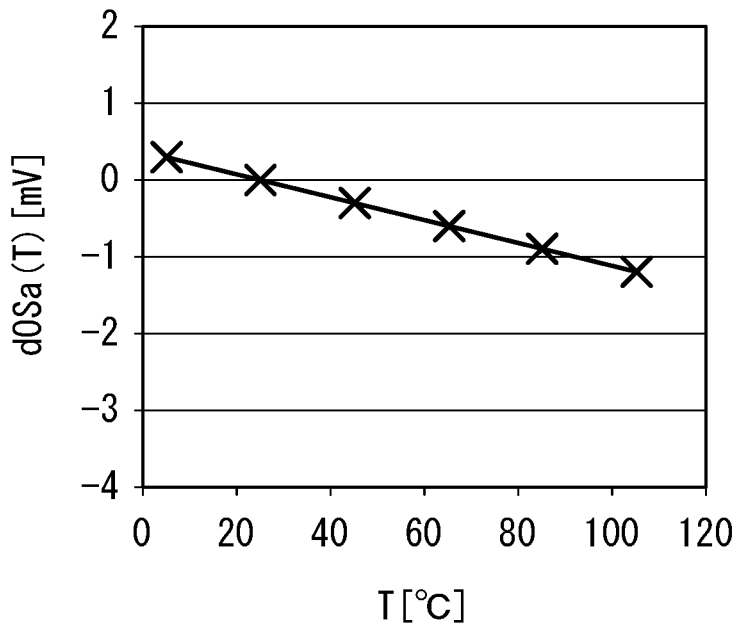
FIG. 11 is a characteristic diagram illustrating a temperature characteristic of an offset change estimate in an offset correction method of a second comparative example.

FIG. 11 shows the temperature characteristic of the offset change estimate dOSa(T). In FIG. 11, the horizontal axis represents temperature T, and the vertical axis represents offset change estimate dOSa(T).

Figure 12:
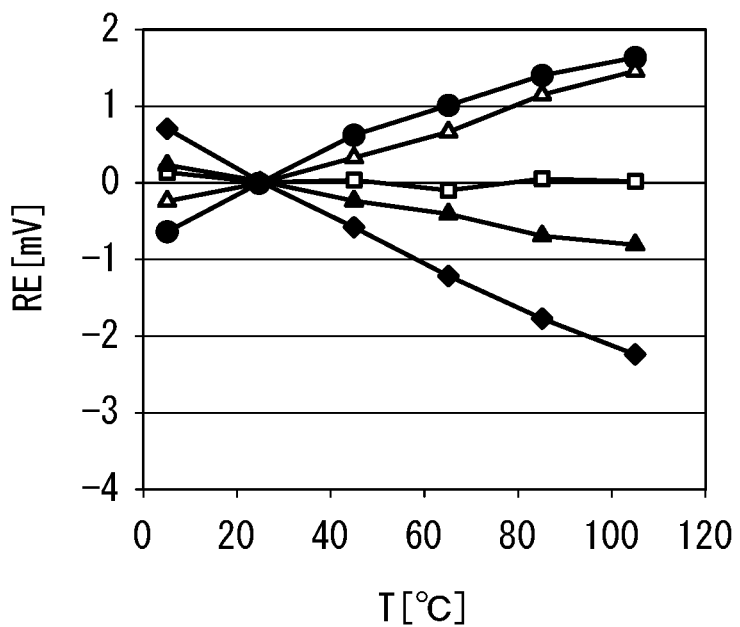
FIG. 12 is a characteristic diagram illustrating temperature characteristics of offset residuals in the offset correction method of the second comparative example.

FIG. 12 shows the temperature characteristics of the offset residuals RE for the five samples when the offset correction method of the second comparative example is applied thereto. In FIG. 12, the horizontal axis represents temperature T, and the vertical axis represents offset residual RE. As shown in FIG. 12, the offset residuals RE of some samples are large in absolute value when the temperature T is other than 25° C. Thus, the offset correction method of the second comparative example cannot accomplish appropriate offset correction in consideration of changes in offset in response to changes in temperature.

Now, the offset estimation method according to the embodiment and the operation of the offset estimation unit 51 will be described in detail. In the following description, an example in which the offset estimation method according to the embodiment is performed using the five samples having the characteristics shown in FIG. 9 will be referred to as the practical example.

To begin with, the initial function will be described. The initial function is basically expressed by Eq. (3) below.

$$OSes(T)=OSst+dOS(T) \quad (3)$$

In Eq. (3), dOS(T) represents an offset change estimate. The offset change estimate dOS(T) is an estimate of the amount of change of the offset OS at a temperature T from the reference offset OSst. The offset change estimate dOS(T) is expressed by Eq. (4) below.

$$dOS(T)=A(OSst) \times (T-Tst) \quad (4)$$

In Eq. (4), A(OSst) represents the gradient of change in the offset change estimate dOS(T) with respect to a change in temperature T. A(OSst) is settled by the reference offset OSst.

From Eqs. (3) and (4), the initial function is expressed by Eq. (5) below.

$$OSes(T)=OSst+A(OSst) \times (T-Tst) \quad (5)$$

The gradient A(OSst) in Eq. (5) is expressed by Eq. (6) below.

$$A(OSst)=k \times OSst+C \quad (6)$$

The initial function expressed by Eq. (5) is a function with the reference offset OSst as the first variable and the temperature T as the second variable. As expressed by Eq. (6), the gradient A(OSst) in Eq. (5) is a function with the reference offset OSst as a variable. Hereinafter, "k" in Eq. (6) will be referred to as gradient coefficient. "C" in Eq. (6) is a constant.

Next, the initial function generation procedure S101 will be described. In the initial function generation procedure S101, as mentioned previously, the initial function is generated by performing measurement using a plurality of samples of the magnetic sensor 12 for use in the current sensor 1. The plurality of samples have the same design configuration.

The initial function generation procedure S101 includes a first step and a second step. The first step determines reference offsets OSst and gradients G of changes in the offsets OS with respect to a change in temperature T for the plurality of samples. The gradients G are in units of mV/° C.

The offset OS of each sample is the value of the magnetic field detection value S of the sample determined in a state where there is no target magnetic field Htg. The reference offset OSst of each sample is the value of the offset OS of the sample determined at the reference temperature Tst.

The gradient G of each sample is determined in the following manner. Initially, for each sample, values OS1 and OS2 of the offset OS are determined at temperatures T1 and T2 different from each other. The temperature T2 is higher than the temperature T1. Next, (OS2−OS1)/(T2−T1) is determined. The result is the gradient G If either one of the temperatures T1 and T2 is assumed to be the reference temperature Tst, either one of the values OS1 and OS2 can be efficiently determined by determining the reference offset OSst.

Figure 13:
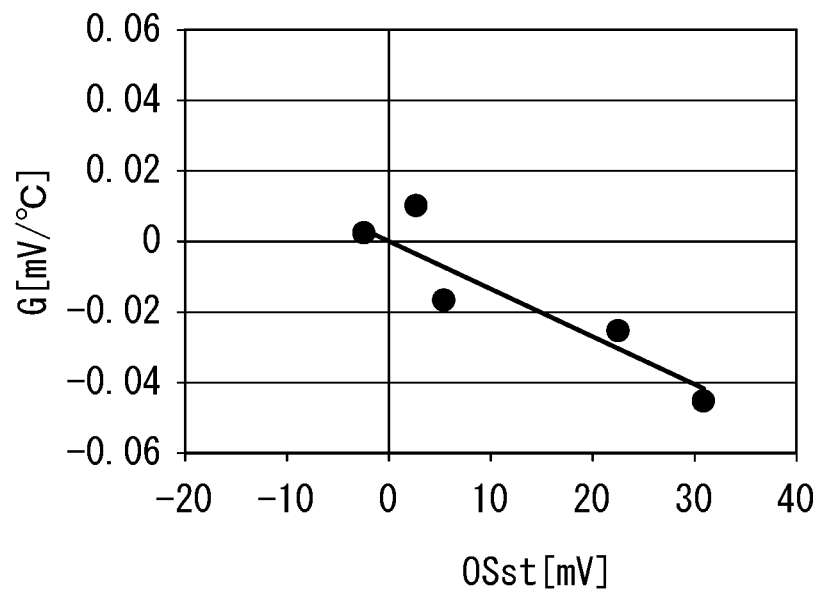
FIG. 13 is a characteristic diagram illustrating a method for determining a gradient coefficient of an initial function in a practical example.

FIG. 13 shows, by five black-filled circles, the reference offsets OSst and the gradients G determined for the five samples in the practical example. In FIG. 13, the horizontal axis represents reference offset OSst, and the vertical axis represents gradient G.

The second step determines the gradient coefficient k and the constant C in Eq. (6) on the basis of the reference offsets OSst and the gradients G determined for the plurality of samples in the first step. More specifically, the second step determines the gradient coefficient k and the constant C by determining the approximate equation expressed by Eq. (6) from the reference offsets OSst and the gradients G of the plurality of samples by using, for example, the least squares method.

If the value of the constant C determined from the approximate equation is known in advance to be close to 0, then the value of the constant C in Eq. (6) may be assumed to be 0. In such a case, in the second step, the gradient coefficient k may be determined by determining an approximate equation in which 0 is substituted into the value of the constant C in Eq. (6).

The straight line on the graph in FIG. 13 represents the approximate expression determined by substituting 0 into the value of the constant C in Eq. (6) for the practical example. The value of the gradient coefficient k determined from the approximate equation is −0.00134.

In the initial function generation procedure S101, the first and second steps described above are performed to settle the function expressed by Eq. (6). In this function, the gradient A(OSst) is determined by the value of the reference offset OSst.

Once the function expressed by Eq. (6) has been settled, the initial function expressed by Eq. (5) is settled. In the initial function generation procedure S101, the initial function thus generated is stored into the initial function storing unit 53. This completes the current sensor 1 as a product.

Next, the function settlement procedure S102 will be described. The function settlement procedure S102 is performed on each individual current sensor 1 as a product. The function settlement procedure S102 is performed at the reference temperature Tst in a state where there is no target magnetic field Htg. In such a state, the magnetic field detection value S output from the magnetic sensor 12 is input to the function settlement unit 54. The value of the magnetic field detection value S in such a state represents the reference offset OSst. The function settlement unit 54 thus receives the reference offset OSst.

In the function settlement procedure S102, the function settlement unit 54 settles the value of the first variable of the initial function stored in the initial function storing unit 53 by the received reference offset OSst. The initial function is thereby turned into an estimate determination function. The estimate determination function is a function obtained by settling the value of the reference offset OSst in the initial function expressed by Eqs. (5) and (6) depending on individual current sensors 1.

Figure 14:
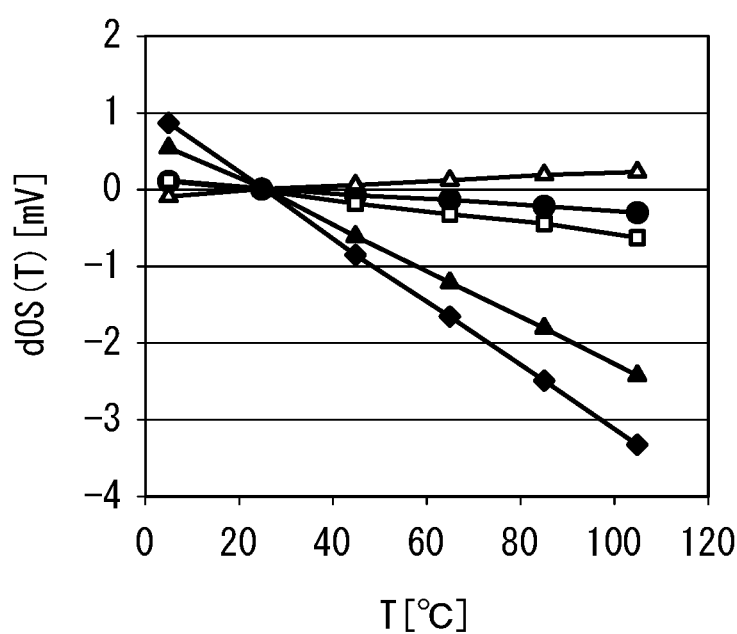
FIG. 14 is a characteristic diagram illustrating temperature characteristics of offset change estimates in the practical example.

FIG. 14 shows the temperature characteristics of the offset change estimates dOS(T) in the estimate determination functions determined in the practical example. In FIG. 14, the horizontal axis represents temperature T, and the vertical axis represents offset change estimate dOS(T).

Next, the estimate determination procedure S103 will be described. In the estimate determination procedure S103, the estimate determination unit 55 receives temperature information indicative of the temperature T from the temperature sensor 15. The estimate determination unit 55 then settles the value of the second variable of the estimate determination function by the received temperature information, and thereby determines the estimate OSes(T) by using the estimate determination function.

The estimate determination unit 55 transmits the determined estimate OSes(T) to the correction unit 52 in the feedback control circuit 31. The feedback control circuit 31 controls the feedback current in accordance with the magnetic field detection value S or the S-based value after correction by the correction unit 52.

Figure 15:
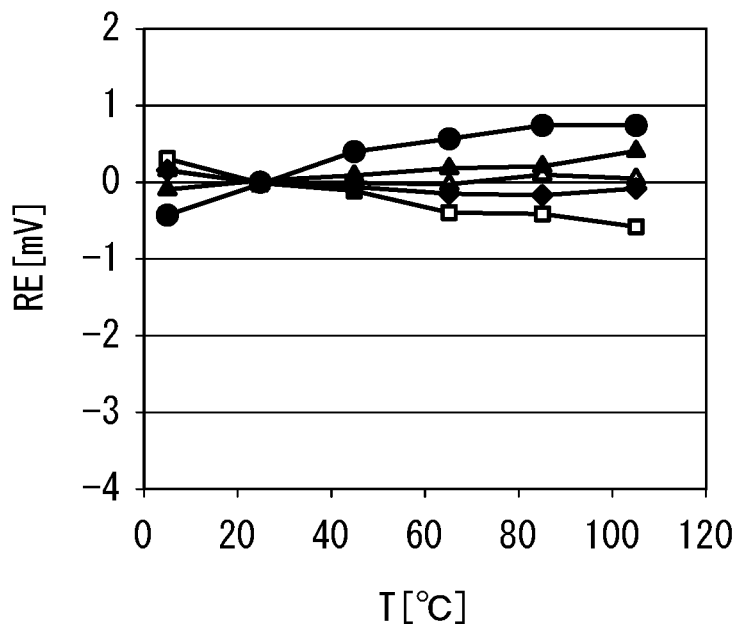
FIG. 15 is a characteristic diagram illustrating temperature characteristics of offset residuals in the practical example.

FIG. 15 shows the temperature characteristics of the offset residuals RE in the practical example. In FIG. 15, the horizontal axis represents temperature T, and the vertical axis represents offset residual RE. According to the temperature characteristics of the offset residuals RE in the practical example, the offset residuals RE are smaller in absolute value regardless of the samples and regardless of the temperature T, when compared with the temperature characteristics of the offset residuals RE in the first and second comparative examples shown in FIGS. 10 and 12.

In this embodiment, the gradient A(OSst) in the initial function expressed by Eqs. (5) and (6) is settled only by the value of the reference offset OSst of each individual magnetic sensor 12. The settlement utilizes the presence of a high correlation between the reference offset OSst and the gradient G of change in the offset OS with respect to a change in the temperature T in the magnetic sensors 12, particularly the magnetic sensors 12 that include magnetoresistive elements, given that the design configurations of the magnetic sensors 12 are the same. Now, a description will be given of the result of an experiment in which the presence of a high correlation between the reference offset OSst and the gradient G was confirmed.

For the experiment, a plurality of samples of a first kind and a plurality of samples of a second kind were fabricated. The plurality of samples of the first kind were a plurality of samples of magnetic sensors 12 having the same design configuration. The plurality of samples of the first kind were simultaneously fabricated under the same condition. The plurality of samples of the second kind were also a plurality of samples of magnetic sensors 12 having the same design configuration. The plurality of samples of the second kind were simultaneously fabricated under a condition different from that for the plurality of samples of the first kind.

Figure 16:
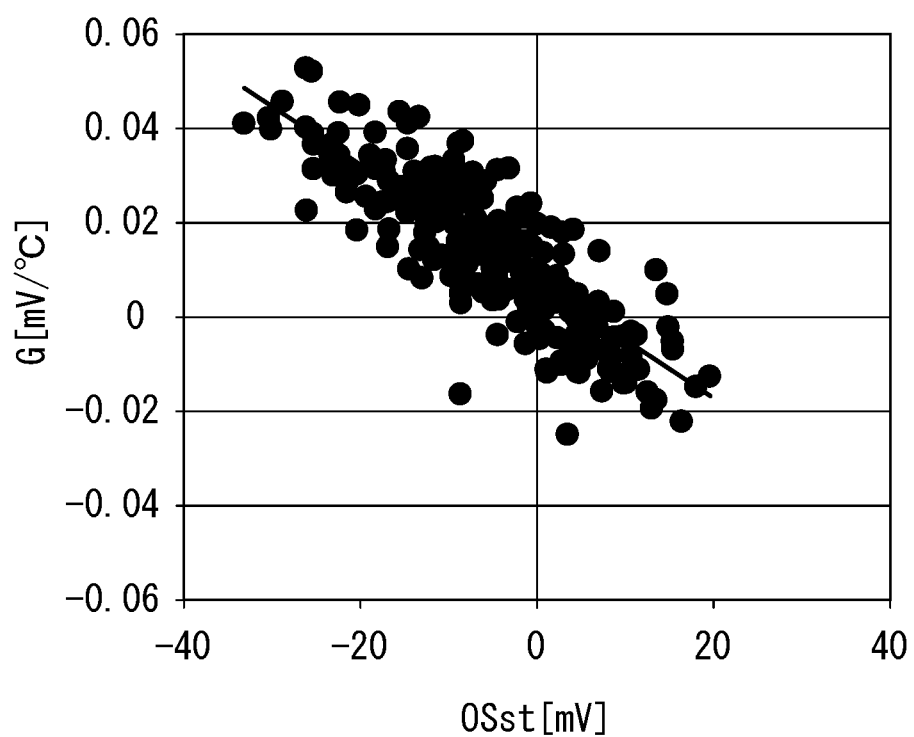
FIG. 16 is a characteristic diagram illustrating gradients of changes in the offsets with respect to a reference offset and temperature change for a plurality of samples of a first kind.
Figure 17:
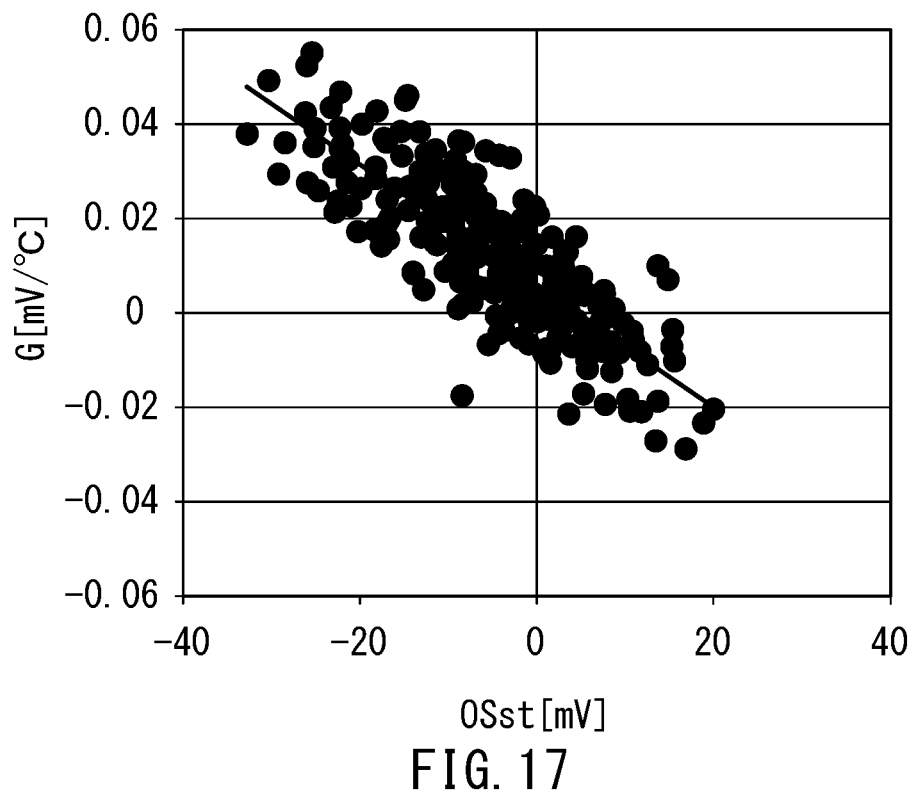
FIG. 17 is a characteristic diagram illustrating gradients of changes in the offsets with respect to a reference offset and temperature change for a plurality of samples of a second kind.

In FIG. 16, reference offsets OSst and gradients G determined for the plurality of samples of the first kind are shown by a plurality of black-filled circles. In FIG. 17, reference offsets OSst and gradients G determined for the plurality of samples of the second kind are shown by a plurality of black-filled circles. In FIGS. 16 and 17, the horizontal axis represents reference offset OSst, and the vertical axis represents gradient G The straight line on the graph in FIG. 16 represents the approximate equation expressed by Eq. (6), determined for the plurality of samples of the first kind by using the least squares method. The straight line on the graph in FIG. 17 represents the approximate equation expressed by Eq. (6), determined for the plurality of samples of the second kind by using the least squares method.

From FIGS. 16 and 17, it can be seen that there is a high correlation between the reference offset OSst and the gradient G in a plurality of magnetic sensors 12 having the same design configuration. The gradient A(OSst) in the initial function can therefore be settled only by the value of the reference offset OSst of each individual magnetic sensor 12.

The ratio of the offset residual RE to the maximum absolute value of the magnetic field detection value S assumed for the current sensor 1 will be referred to as offset residual ratio RER. The lower the offset residual ratio RER is, the smaller the error of the current detection value resulting from the offset OS of the magnetic field detection value S can be said to be.

Figure 18:
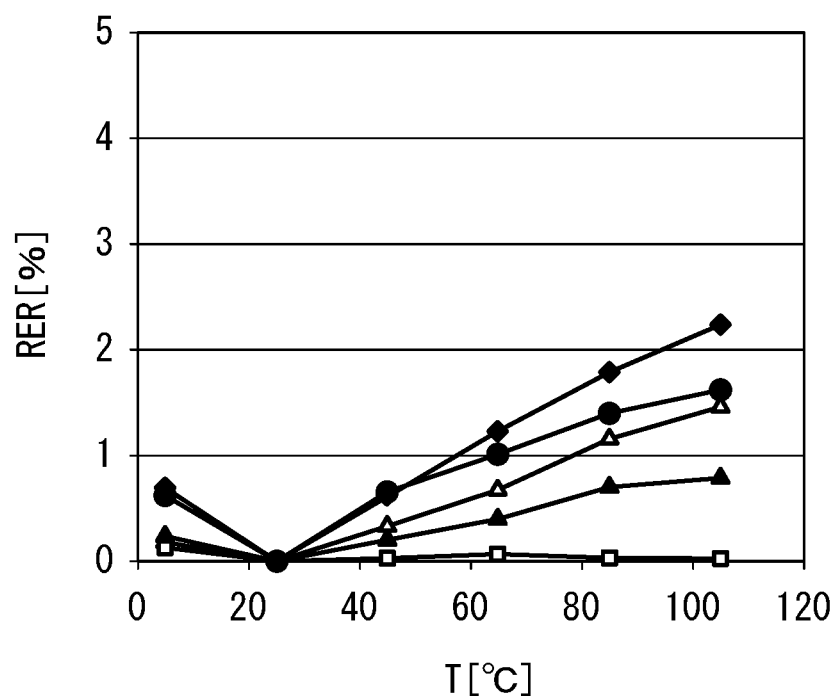
FIG. 18 is a characteristic diagram illustrating temperature characteristics of offset residual ratios in the second comparative example.
Figure 19:
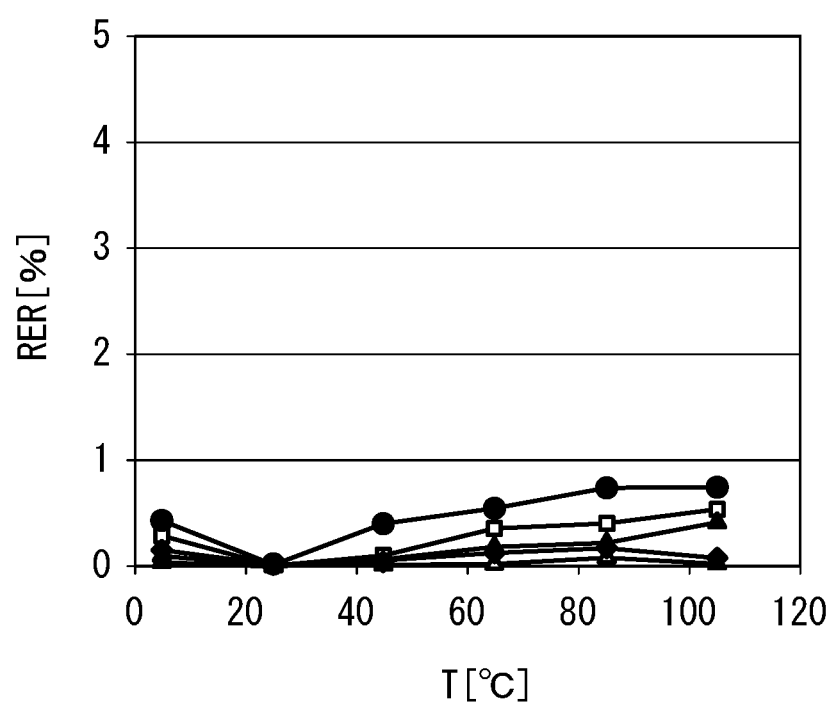
FIG. 19 is a characteristic diagram illustrating temperature characteristics of offset residual ratios in the practical example.

FIG. 18 shows the temperature characteristics of the offset residual ratios RER in the second comparative example. FIG. 19 shows the temperature characteristics of the offset residual ratios RER in the practical example. Here, the maximum absolute value of the magnetic field detection value S assumed for the current sensor 1 is 100 mV. In FIGS. 18 and 19, the horizontal axis represents temperature T, and the vertical axis represents offset residual ratio RER.

A comparison between FIG. 18 and FIG. 19 shows that the offset residual ratios RER in the practical example are smaller than those in the second comparative example, regardless of the samples and regardless of the temperature T.

As has been described, this embodiment makes it possible to perform appropriate offset estimation and offset correction in consideration of changes in offset OS of the magnetic field detection value S in response to changes in temperature.

In this embodiment, the estimate determination function is settled only by the value of the reference offset OSst of each individual magnetic sensor 12. The reference offset OSst is easily obtainable at the reference temperature Tst which is, for example, a normal temperature. The embodiment thus makes it possible to perform appropriate offset estimation and offset correction in consideration of changes in offset OS of the magnetic field detection value S in response to changes in temperature by relatively simple processing.

The reference offset OSst may become different from its initial value for some reason after the installation of the current sensor 1. An example of possible reasons therefor is that a high magnetic field is applied to the magnetic sensor 12 to cause a magnetic layer included in the magnetic sensor 12 to change into a magnetization structure different from in a normal state. In such a case, the error of the current detection value can be greater than the initial one if the estimate determination function is left unchanged from the initial one.

Even in such a case, according to this embodiment, the function settlement procedure S102 can be performed again to change the estimate determination function on the basis of the value of the reference offset OSst at that point in time. This can prevent the error of the current detection value from increasing.

According to the technique described in U.S. Pat. No. 8,350,563 B2, offsets at a plurality of temperatures are measured to generate an offset characteristic curve representing the characteristic of changes in offset in response to changes in temperature. From the viewpoint of cost, it is not easy to measure offsets at a plurality of temperatures for all current sensors 1 as products after installation of the current sensors 1. It is thus difficult, according to the aforementioned technique, to generate and change the offset characteristic curves after installation of the current sensors 1.

The present invention is not limited to the foregoing embodiment, and various modifications may be made thereto. For example, the initial function in the present invention is not limited to that expressed by Eqs. (5) and (6).

The offset estimation apparatus and method and the correction apparatus for a magnetic sensor of the present invention are applicable not only to current sensors but also to various systems that use magnetic sensors.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiment.

What is claimed is:

1. An offset estimation apparatus for determining an estimate of an offset of a magnetic field detection value to be output from a magnetic sensor that detects a magnetic field to be detected and generates the magnetic field detection value dependent on a strength of the magnetic field to be detected, the offset being a deviation of the magnetic field detection value from a predetermined reference value when there is no magnetic field to be detected, the offset estimation apparatus comprising:
an initial function storing unit configured to store an initial function for determining the estimate according to a first function with a reference offset as a first variable and a second function with temperature as a second variable, the reference offset being the offset at a reference temperature;
a function settlement unit configured to receive the reference offset, settle a value of the first variable of the initial function stored in the initial function storing unit by the received reference offset, and thereby turn the initial function into an estimate determination function for determining the estimate according to a value of the second variable; and
an estimate determination unit configured to receive temperature information indicative of temperature, settle the value of the second variable of the estimate determination function by the received temperature information, and thereby determine the estimate by using the estimate determination function.

2. The offset estimation apparatus according to claim 1, wherein the initial function is expressed as $OSes(T)=OSst+A(OSst)\times(T-Tst)$, where $OSes(T)$ is the estimate of the offset, $OSst$ is the reference offset, $T$ is the temperature indicated by the temperature information, $Tst$ is the reference temperature, and $A(OSst)$ is a gradient of change of $dOS(T)$ with respect to a change in the temperature, $dOS(T)$ being an offset change estimate, the offset change estimate being an estimate of an amount of change of the offset at the temperature T from the reference offset, wherein $A(OSst)$ is determined by the value of the reference offset.

3. The offset estimation apparatus according to claim 1, wherein the initial function storing unit, the function settlement unit and the estimate determination unit are each composed of a signal processing circuit.

4. The offset estimation apparatus according to claim 1, wherein the initial function storing unit, the function settlement unit and the estimate determination unit are each composed of a digital signal processing circuit.

5. An offset estimation method for determining an estimate of an offset of a magnetic field detection value to be output from a magnetic sensor that detects a magnetic field to be detected and generates the magnetic field detection value dependent on a strength of the magnetic field to be detected, the offset being a deviation of the magnetic field detection value from a predetermined reference value when there is no magnetic field to be detected, the offset estimation method comprising:
an initial function generation procedure of generating an initial function for determining the estimate according to a first function with a reference offset as a first variable and a second function with temperature as a second variable, the reference offset being the offset at a reference temperature;
a function settlement procedure of receiving the reference offset, settling a value of the first variable of the initial function by the received reference offset, and thereby turning the initial function into an estimate determination function for determining the estimate according to a value of the second variable; and
an estimate determination procedure of receiving temperature information indicative of temperature, settling the value of the second variable of the estimate determination function by the received temperature information, and thereby determining the estimate by using the estimate determination function.

6. The offset estimation method according to claim 5, wherein the initial function is expressed as $OSes(T)=OSst+A(OSst)\times(T-Tst)$, where $OSes(T)$ is the estimate of the offset, $OSst$ is the reference offset, $T$ is the temperature indicated by the temperature information, $Tst$ is the reference temperature, and $A(OSst)$ is a gradient of change of $dOS(T)$ with respect to a change in the temperature, $dOS(T)$ being an offset change estimate, the offset change estimate being an estimate of an amount of change of the offset at the temperature T from the reference offset, wherein $A(OSst)$ is determined by the value of the reference offset.

7. The offset estimation method according to claim 6, wherein

A(OSst) is expressed as k×OSst+C, and the initial function generation procedure includes:
- a first step of determining respective reference offsets and respective gradients of changes in the offsets with respect to a change in the temperature for a plurality of samples of the magnetic sensor; and
- a second step of determining k and C on the basis of the reference offsets and the gradients obtained for the plurality of samples in the first step, wherein k is a coefficient and C is a constant.

8. The offset estimation method according to claim 5, wherein the function settlement procedure and the estimate determination procedure are each performed by a signal processing circuit.

9. The offset estimation method according to claim 5, wherein the function settlement procedure and the estimate determination procedure are each performed by a digital signal processing circuit.

10. A correction apparatus for a magnetic sensor, for correcting a magnetic field detection value to be output from the magnetic sensor or a value obtained on the basis of the magnetic field detection value, the magnetic sensor detecting a magnetic field to be detected and generating the magnetic field detection value dependent on a strength of the magnetic field to be detected, the correction apparatus comprising:
- an offset estimation unit for determining an estimate of an offset of the magnetic field detection value, the offset being a deviation of the magnetic field detection value from a predetermined reference value when there is no magnetic field to be detected; and
- a correction unit for correcting the magnetic field detection value or the value obtained on the basis of the magnetic field detection value, by using the estimate determined by the offset estimation unit, the offset estimation unit including:
- an initial function storing unit configured to store an initial function for determining the estimate according to a first function with a reference offset as a first variable and a second function with temperature as a second variable, the reference offset being the offset at a reference temperature;
- a function settlement unit configured to receive the reference offset, settle a value of the first variable of the initial function stored in the initial function storing unit by the received reference offset, and thereby turn the initial function into an estimate determination function for determining the estimate according to a value of the second variable; and
- an estimate determination unit configured to receive temperature information indicative of temperature, settle the value of the second variable of the estimate determination function by the received temperature information, and thereby determine the estimate by using the estimate determination function.

11. The correction apparatus according to claim 10, wherein the initial function is expressed as OSes(T)=OSst+A(OSst)×(T−Tst), where OSes(T) is the estimate of the offset, OSst is the reference offset, T is the temperature indicated by the temperature information, Tst is the reference temperature, and A(OSst) is a gradient of change of dOS(T) with respect to a change in the temperature, dOS(T) being an offset change estimate, the offset change estimate being an estimate of an amount of change of the offset at the temperature T from the reference offset, wherein A(OSst) is determined by the value of the reference offset.

12. The correction apparatus according to claim 10, wherein the offset estimation unit and the correction unit are each composed of a signal processing circuit.

13. The correction apparatus according to claim 10, wherein the offset estimation unit and the correction unit are each composed of a digital signal processing circuit.

14. A current sensor comprising:
- a coil for generating a second magnetic field that cancels out a first magnetic field generated by a current to be detected;
- a magnetic sensor for detecting, as a magnetic field to be detected, a residual magnetic field between the first magnetic field and the second magnetic field, and generating a magnetic field detection value dependent on a strength of the magnetic field to be detected;
- a feedback circuit for controlling, in accordance with the magnetic field detection value or a value obtained on the basis of the magnetic field detection value, a feedback current for generating the second magnetic field, and passing the feedback current through the coil;
- a current detector for detecting a value of the feedback current; and
- a correction apparatus for correcting the magnetic field detection value or the value obtained on the basis of the magnetic field detection value, the correction apparatus including:
- an offset estimation unit for determining an estimate of an offset of the magnetic field detection value, the offset being a deviation of the magnetic field detection value from a predetermined reference value when there is no magnetic field to be detected; and
- a correction unit for correcting the magnetic field detection value or the value obtained on the basis of the magnetic field detection value, by using the estimate determined by the offset estimation unit, the offset estimation unit including:
- an initial function storing unit configured to store an initial function for determining the estimate according to a first function with a reference offset as a first variable and a second function with temperature as a second variable, the reference offset being the offset at a reference temperature;
- a function settlement unit configured to receive the reference offset, settle a value of the first variable of the initial function stored in the initial function storing unit by the received reference offset, and thereby turn the initial function into an estimate determination function for determining the estimate according to a value of the second variable; and
- an estimate determination unit configured to receive temperature information indicative of temperature, settle the value of the second variable of the estimate determination function by the received temperature information, and thereby determine the estimate by using the estimate determination function.

15. The current sensor according to claim 14, wherein the initial function is expressed as OSes(T)=OSst+A(OSst)×(T−Tst), where OSes(T) is the estimate of the offset, OSst is the reference offset, T is the temperature indicated by the temperature information, Tst is the reference temperature, and A(OSst) is a gradient of change of dOS(T) with respect to a change in the temperature, dOS(T) being an offset change estimate, the offset change estimate being an estimate of an amount of change of the offset at the temperature T from the reference offset, wherein A(OSst) is determined by the value of the reference offset.

16. The current sensor according to claim 14, wherein the magnetic sensor includes a magnetoresistive element.

17. The current sensor according to claim 14, further comprising a temperature sensor for generating the temperature information.

18. The current sensor according to claim 14, wherein the offset estimation unit and the correction unit are each composed of a signal processing circuit.

19. The current sensor according to claim 14, wherein the offset estimation unit and the correction unit are each composed of a digital signal processing circuit.

\* \* \* \* \*